United States Patent
Chiang et al.

(10) Patent No.: US 11,145,347 B1
(45) Date of Patent: Oct. 12, 2021

(54) MEMORY DEVICE AND MEMORY CIRCUIT

(71) Applicant: Taiwan Semiconductor Manufacturing Co., Ltd., Hsinchu (TW)

(72) Inventors: Hung-Li Chiang, Taipei (TW); Tzu-Chiang Chen, Hsinchu (TW); Katherine H. Chiang, New Taipei (TW); Ming-Yuan Song, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/880,971

(22) Filed: May 21, 2020

(51) Int. Cl.
   *G11C 11/16*   (2006.01)
   *G11C 11/18*   (2006.01)
   *H01L 27/22*   (2006.01)

(52) U.S. Cl.
   CPC .......... *G11C 11/1659* (2013.01); *G11C 11/18* (2013.01); *H01L 27/224* (2013.01)

(58) Field of Classification Search
   CPC .... G11C 11/1659; G11C 11/18; H01L 27/224
   USPC .................................................. 365/158, 173
   See application file for complete search history.

(56) References Cited

U.S. PATENT DOCUMENTS

| | | | | |
|---|---|---|---|---|
| 6,714,442 B1* | 3/2004 | Nahas | ...... | G11C 11/16 365/158 |
| 7,272,035 B1* | 9/2007 | Chen | ...... | G11C 11/16 365/158 |
| 9,715,916 B1* | 7/2017 | Tomishima | ...... | G11C 11/1675 |
| 9,734,882 B2* | 8/2017 | Toh | ...... | G11C 11/161 |
| 10,483,457 B1* | 11/2019 | Lee | ...... | G11C 11/1673 |
| 2002/0057593 A1* | 5/2002 | Hidaka | ...... | G11C 11/1675 365/171 |
| 2003/0026125 A1* | 2/2003 | Hidaka | ...... | G11C 11/1655 365/158 |
| 2007/0211523 A1* | 9/2007 | Kim | ...... | H01L 27/226 365/158 |
| 2007/0297223 A1* | 12/2007 | Chen | ...... | G11C 11/16 365/173 |
| 2008/0002481 A1* | 1/2008 | Gogl | ...... | G11C 5/04 365/189.06 |
| 2009/0175108 A1* | 7/2009 | Dittrich | ...... | G11C 7/14 365/210.1 |
| 2009/0244965 A1* | 10/2009 | Reohr | ...... | G11C 11/1659 365/173 |
| 2012/0099358 A1* | 4/2012 | Sunaga | ...... | G11C 11/1657 365/66 |

(Continued)

*Primary Examiner* — Michael T Tran
(74) *Attorney, Agent, or Firm* — JCIPRNET

(57) ABSTRACT

A memory device and a memory circuit is provided. The memory device includes a magnetic tunnel junction (MTJ), a read word line, a read selector, a write word line and a write selector. The read word line is connected to the MTJ with the read selector in between. The read word line is electrically connected to the MTJ when the read selector is turned on, and electrically disconnected from the MTJ when the read selector is in an off state. The write word line is connected to the MTJ with the write selector in between. The write word line is electrically connected to the MTJ when the write selector is turned on, and electrically disconnected from the MTJ when the write selector is off. A turn-on voltage of the write selector is greater than a turn-on voltage of the read selector.

20 Claims, 13 Drawing Sheets

(56) References Cited

U.S. PATENT DOCUMENTS

| | | | | |
|---|---|---|---|---|
| 2013/0033931 | A1* | 2/2013 | Yamane | H01L 43/02 365/171 |
| 2014/0177318 | A1* | 6/2014 | Ting | G11C 14/00 365/148 |
| 2016/0196870 | A1* | 7/2016 | Miyano | G11C 11/419 365/72 |
| 2016/0225429 | A1* | 8/2016 | Toh | G11C 11/1675 |
| 2016/0225819 | A1* | 8/2016 | Toh | H01L 27/228 |
| 2017/0077177 | A1* | 3/2017 | Shimomura | G11C 11/1675 |
| 2017/0270985 | A1* | 9/2017 | Shimomura | G11C 11/161 |
| 2018/0061467 | A1* | 3/2018 | Kan | G11C 11/1675 |
| 2018/0114557 | A1* | 4/2018 | Park | G11C 11/18 |
| 2018/0123022 | A1* | 5/2018 | Sasaki | H01L 43/08 |
| 2019/0198754 | A1* | 6/2019 | Lin | H01L 43/10 |
| 2019/0362765 | A1* | 11/2019 | Park | G11C 8/08 |
| 2020/0135252 | A1* | 4/2020 | Gupta | G11C 11/1659 |
| 2020/0265887 | A1* | 8/2020 | Atsumi | H01L 27/1156 |
| 2020/0411094 | A1* | 12/2020 | Jaiswal | G11C 11/4094 |
| 2021/0005251 | A1* | 1/2021 | Wang | G11C 11/161 |
| 2021/0043683 | A1* | 2/2021 | Chiang | G11C 11/161 |
| 2021/0050508 | A1* | 2/2021 | Lee | H01F 10/329 |
| 2021/0066580 | A1* | 3/2021 | Song | H01L 43/12 |
| 2021/0083170 | A1* | 3/2021 | Sawada | H01L 43/08 |
| 2021/0134362 | A1* | 5/2021 | Diaz | G11C 13/0069 |
| 2021/0151505 | A1* | 5/2021 | Han | H01L 43/02 |

\* cited by examiner

MEMORY DEVICE AND MEMORY CIRCUIT

BACKGROUND

Many modern electronic devices contain electronic memory. Electronic memory may be volatile memory or non-volatile memory. Non-volatile memory is able to retain data in absence of power, whereas volatile memory loses data when power is cut off. Magnetoresistive random-access memory (MRAM), which uses electron spin to store data, is one promising candidate for next generation non-volatile electronic memory due to advantages over current electronic memory. Compared to current non-volatile memory, such as flash random-access memory, MRAM is faster and has better endurance. Compared to current volatile memory, such as dynamic random-access memory (DRAM) and static random-access memory (SRAM), MRAM has similar performance and density, but lower power consumption.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
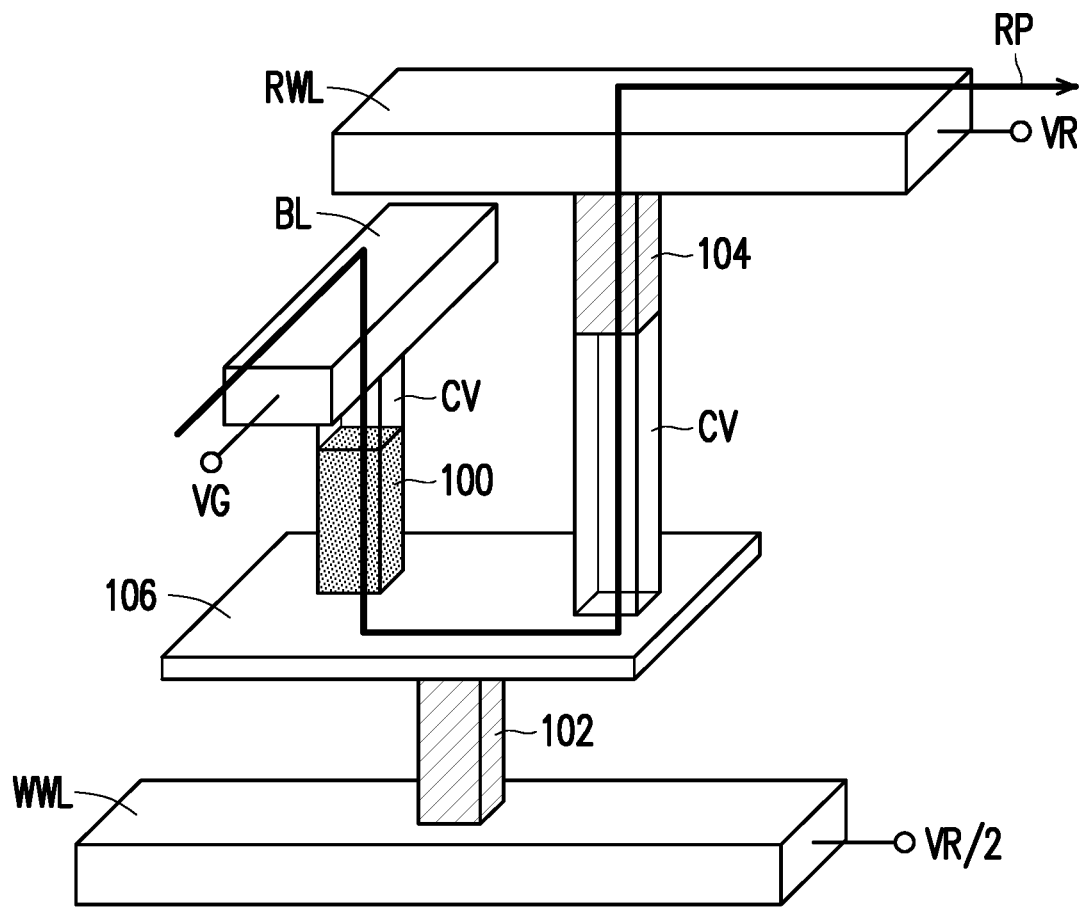
FIG. 1A is a schematic three-dimensional view illustrating a read path of a memory device according to some embodiments of the present disclosure.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1B:
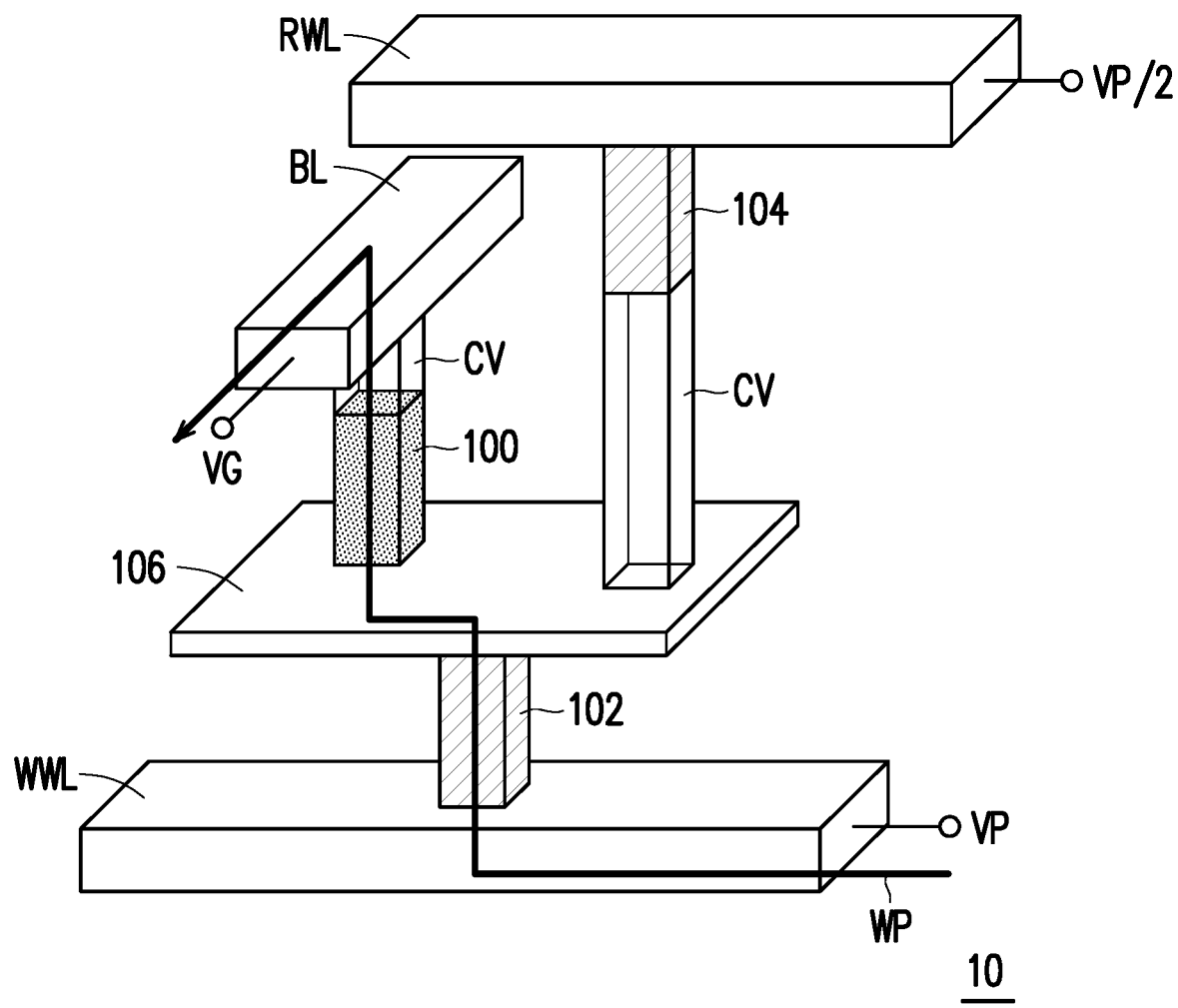
FIG. 1B is a schematic three-dimensional view illustrating a write path of a memory device according to some embodiments of the present disclosure.

FIG. 1A is a schematic three-dimensional view illustrating a read path RP of a memory device 10 according to some embodiments of the present disclosure. FIG. 1B is a schematic three-dimensional view illustrating a write path WP of the memory device 10.

Referring to FIG. 1A and FIG. 1B, the memory device 10 is a magnetoresistive random-access memory (MRAM) device. In some embodiments, the memory device 10 is embedded in an interconnection structure (not shown) formed over logic devices (not shown, such as active devices, passive devices or a combination thereof). At least a portion of the logic devices may be configured to control the memory device 10. The memory device 10 includes a magnetic tunnel junction (MTJ) 100. Although not shown, the MTJ 100 may include an insulating layer (or referred as a tunnel barrier) sandwiched between ferromagnetic layers including a pinned layer and a free layer. Magnetization direction of the free layer can be switched by an external magnetic field, whereas magnetization direction of the pinned layer is fixed. If the magnetizations of the free layer and the pinned layer are in a parallel orientation, it is more likely that electrons will tunnel through the insulating layer than if the magnetizations are in oppositional (antiparallel) orientation. Consequently, the MTJ 100 can be switched between a high resistance state and a low resistance state, and can be functioned as a magnetoresistive storage unit. In some embodiments, the memory device 10 is a spin-torque transfer (STT) MRAM device. In these embodiments, the MTJ 100 is programmed by using a STT effect. The STT effect enables charges flowing through the MTJ 100 to transfer spin angular momentum between the free layer and the pinned layer, which results in a torque on the magnetization of the free layer. In this way, the magnetic state of the free layer can be changed, and data can be written into the MTJ 100.

In those embodiments where the memory device 10 is a STT MRAM device, the magnetoresistive storage unit (i.e., the MTJ 100) has two terminals. A terminal of the MTJ 100 (e.g., a top terminal of the MTJ 100) is electrically connected to a bit line BL, and the other terminal of the MTJ 100 (e.g., a bottom terminal of the MTJ 100) is connected to a read word line RWL and a write word line WWL. The read word line RWL and the write word line WWL would not be electrically connected to the MTJ 100 at the same time. The write word line WWL is electrically disconnected from the MTJ 100 when the read word line RWL is in electrical contact with the MTJ 100 during a read operation, and the read word line RWL is electrically disconnected form the MTJ 100 when the write word line WWL is in electrical contact with the MTJ 100 during a write operation. Therefore, a write path WP (as shown in FIG. 1B) between the write word line WWL and the bit line BL is cut off when a read path RP (as shown in FIG. 1A) between the read word line RWL and the bit line BL is established during a read operation, and the read path RP is cut off when the write path WP is established during a write operation. In some embodiments, the write word line WWL is connected to the MTJ 100 with a write selector 102 in between, whereas the read word line RWL is connected to the MTJ 100 with a read selector 104 in between. Each of the write selector 102 and the read selector 104 may be a two-terminal selector. When a bias voltage across the write selector 102 exceeds a turn-on voltage of the write selector 102, the write selector 102 becomes conductive, and the write word line WWL can be electrically connected to the MTJ 100, thus the write path WP can be established. On the other hand, the write selector 102 is insulative when a bias voltage across the write selector 102 does not reach the turn-on voltage of the write selector 102, thus the write word line WWL is electrically disconnected from the MTJ 100, and the write path WP is cut off. Similarly, the read word line RWL is in electrical contact with the MTJ 100 to establish the read path RP only when the read selector 104 is turned on during a read operation. By disposing the write selector 102 and the read selector 104, the write path WP and the read path RP can be separately controlled. Therefore, write operation and read operation can be individually optimized without compromising one of the write and read operations for improving another.

In some embodiments, a turn-on voltage of the read selector 104 is lower than a turn-on voltage of the write selector 102. In these embodiments, the read selector 104 may have a smaller on-resistance (i.e., the resistance of the read selector 104 when the read selector 104 is in an on state), as in comparison to the write selector 102. Accordingly, a voltage drop across the read selector 104 on the read path RP during a read operation can be reduced, and reducing the voltage drop across the read selector 104 may result in less degradation of read margin of the MTJ 100.

On the other hand, since the write selector 102 has a relatively high turn-on voltage, the write selector 102 may better suppress write disturbance during a write operation and/or read disturbance during a read operation. Therefore, by disposing the read selector 104 with a lower turn-on voltage and disposing the write selector 102 with a higher turn-on voltage, a read margin of the MTJ 100 can be less reduced without compromising suppression of write disturbance and/or read disturbance.

In some embodiments, the write selector 102 and the read selector 104 are connected to the MTJ 100 through a conductive patch 106. In these embodiments, the MTJ 100 may stand on the conductive patch 106, and is electrically connected to the conductive patch 106. In addition, one of the write selector 102 and the read selector 104 is disposed above and electrically connected to the conductive patch 106, whereas the other one of the write selector 102 and the read selector 104 is disposed below and electrically connected to the conductive patch 106. For instance, as shown in FIG. 1A and FIG. 1B, the read selector 104 is connected to the conductive patch 106 from above the conductive patch 106, whereas the write selector 102 is connected to the conductive patch 106 from below the conductive patch 106. In other words, the MTJ 100 and the read selector 104 are disposed on the conductive patch 106, and the write selector 102 is disposed below the conductive patch 106. In this way, the bit line BL and the read word line RWL may be electrically connected to the MTJ 100 and the read selector 104 from above, respectively, and the write word line WWL may be electrically connected to the write selector 102 from below. Accordingly, the read path RP (as shown in FIG. 1A) passing through the bit line BL, the MTJ 100, the conductive patch 106, the read selector 104 and the read word line RWL is at a single side (e.g., a top side) of the conductive patch 106, whereas the write path WP (as shown in FIG. 1B) passing through the write word line WWL, the write selector 102, the conductive patch 106, the MTJ 100 and the bit line BL is from a side (e.g., a bottom side) of the conductive patch 106 to an opposite side (e.g., a top side) of the conductive patch 106. In some embodiments, the read selector 104 is connected to the conductive patch 106 with a conductive via CV in between, and connected to the overlying read word line RWL without a conductive via in between. In addition, the MTJ 100 may stand on the conductive patch 106 without a conductive via CV in between, while being connected to the overlying bit line BL with a conductive via CV in between. In some embodiments, vertical lengths of the conductive vias CV connected to the MTJ 100 and the read selector 104 may be adjusted, such that the read word line RWL could extend above the bit line BL (as shown in FIG. 1A and FIG. 1B). On the other side of the conductive patch 106, the write selector 102 may be connected to the overlying conductive patch 106 and the underlying write word line WWL without a conductive via in between. Furthermore, in some embodiments, portions of the conductive patch 106 to which the MTJ 100, the read selector 104 and the write selector 102 connect are spaced apart from one another. Those skilled in the art may modify arrangement of the MTJ 100, the read selector 104 and the write selector 102 according to design requirements, the present disclosure is not limited thereto. In addition, the conductive patch 106, the read word line RWL, the write word line WWL and the bit line BL may be made of the same material (e.g., W, Cu, Ru, TiN, TaN, Ti, Ta, the like or combinations thereof), or at least two of the conductive patch 106, the read word line RWL, the write word line WWL and the bit line BL may be made of different materials.

In regarding manufacturing of the memory device 10, material layers (not shown) for forming the MTJ 100 and a conductive layer (not shown) for forming the overlying conductive via CV may be patterned simultaneously, and a lithography process and one or more etching processes may be performed during this patterning step. In these embodiments, sidewalls of the MTJ 100 and the overlying conductive via CV may be substantially coplanar with each other. In addition, the MTJ 100 and the overlying conductive via CV may be collectively regarded as a pillar structure standing on the conductive patch 106, and this pillar structure may or may not be tapered toward the conductive patch 106. Similarly, in some embodiments, a method for forming the read selector 104 and the underlying conductive via CV may include simultaneously patterning material layers (not shown) for forming the read selector 104 and a conductive layer (not shown) for forming this conductive vias CV, and a lithography process and one or more etching processes may be performed during this patterning step. In this way, sidewalls of the read selector 104 and the underlying conductive via CV may be coplanar with each other. In addition, the read selector 104 and the underlying conductive via CV may be collectively regarded as a pillar structure connecting between the conductive patch 106 and the read word line RWL, and this pillar structure may or may not be tapered downwardly. In alternative embodiments, the material layers for forming the MTJ 100 and the conductive layer for forming the overlying conductive via CV may be patterned separately, and a sidewall of the MTJ 100 may or may not be coplanar with a sidewall of the overlying conductive via CV. Similarly, the material layers for forming the read selector 104 and the conductive layer for forming the conductive via CV lying below the read selector 104 may be patterned separately, and sidewalls of the read selector 104 and the underlying conductive via CV may or may not be coplanar with one another.

As shown in FIG. 1A, when the memory device 10 is selected during a read operation, the read word line RWL and the bit line BL are configured to receive a read voltage VR and a reference voltage VG (e.g., a ground voltage), respectively. The read voltage VR should be large enough that a voltage difference between the read voltage VR and a voltage level at the conductive patch 106 (e.g., half of the read voltage VR/2) exceeds a turn-on voltage of the read selector 104, such that read selector 104 can be switched on during a read operation. Once the read selector 104 is turned on, current can pass through the MTJ 100 along the read path RP. This current may be then detected by a sense amplifier (not shown), and a resistance state of the MTJ 100 can be identified. In other words, data stored in the MTJ 100 can be read. As described above, the read selector 104 has a relatively low on-resistance, such that a read margin can be less affected by the read selector 104. In some embodiments, when the memory device 10 is selected during a read operation, the write word line WWL is configured to receive a voltage that can ensure that a voltage bias between the conductive patch 106 and the write word line WWL would not turn on the write selector 102. In this way, the write patch WP as shown in FIG. 1B would not be established during a read operation, and the MTJ 100 can be avoided from being accidentally programmed during a read operation. That is, read disturbance can be prevented. For instance, the write word line WWL may receive a voltage substantially equal to the voltage level at the conductive patch 106 during a read operation. As an example shown in FIG. 1A, the voltage level of the conductive patch 106 and the voltage received by the write word line WWL during a read operation is substantially equal to half of the read voltage VR (i.e., VR/2).

As shown in FIG. 1B, when the memory device 10 is selected during a write operation, the write word line WWL and the bit line BL are configured to receive a write voltage VP and the reference voltage VG, respectively. The write voltage VP should be large enough that a voltage difference between the write voltage VP and a voltage level at the conductive patch 106 (e.g., half of the write voltage VP/2) exceeds a turn-on voltage of the write selector 102, such that the write selector 102 can be switched on during a write operation. Once the write selector 102 is turned on, current path can be established between the write word line WWL and the bit line BL (i.e., the write path WP). In other words, current passes through the MTJ 100 during a write operation. As such, the MTJ 100 can be programmed by using polarized carriers (e.g., electrons) to torque magnetic state of the free layer (not shown) in the MTJ 100. In some embodiments, when the memory device 10 is selected during a write operation, the read word line RWL is configured to receive a voltage that can ensure that a voltage bias between the conductive patch 106 and the read word line RWL would not turn on the read selector 102. Therefore, formation of sneak current (i.e., current from the conductive patch 106 to the read word line RWL) during a write operation can be suppressed. As an example shown in FIG. 1B, the voltage level at the conductive patch 106 and the voltage received by the read word line RWL during a write operation may both be substantially equal to half of the write voltage VP (i.e., VP/2).

Figure 2A:
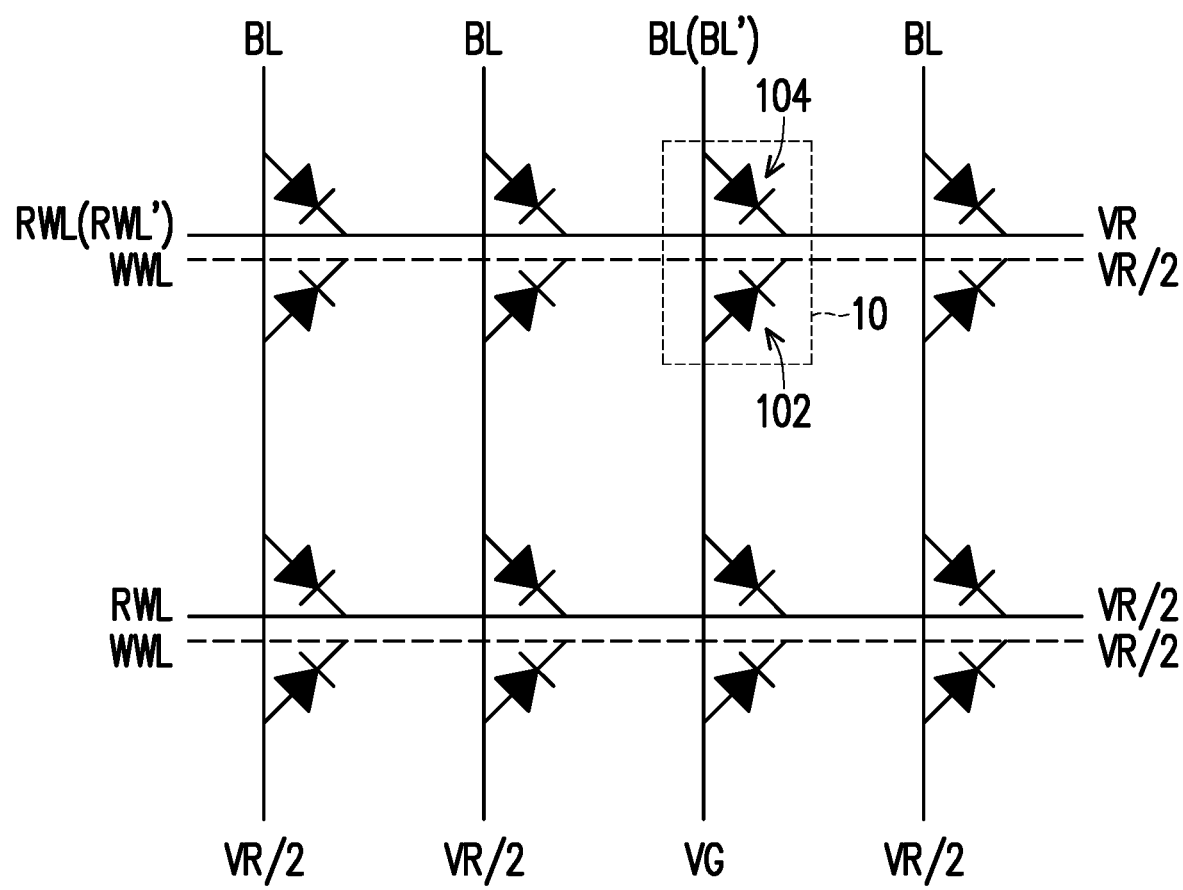
FIG. 2A is a circuit diagram illustrating a memory circuit during a read operation according to some embodiments of the present disclosure.
Figure 2B:
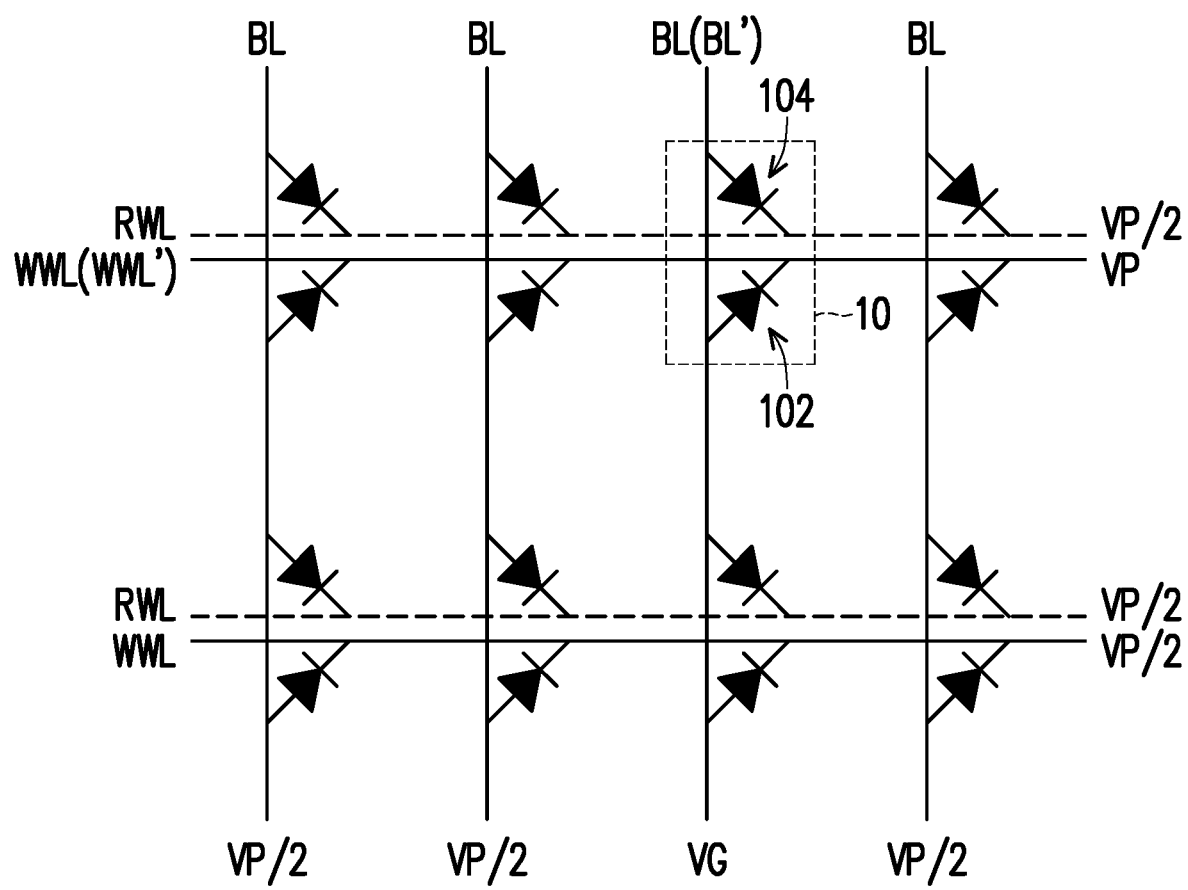
FIG. 2B is a circuit diagram illustrating a memory circuit during a write operation according to some embodiments of the present disclosure.

FIG. 2A is a circuit diagram illustrating a memory circuit 20 during a read operation according to some embodiments of the present disclosure. FIG. 2B is a circuit diagram illustrating the memory circuit 20 during a write operation.

Referring to FIG. 1A, FIG. 1B, FIG. 2A and FIG. 2B, the memory circuit 20 shown in FIG. 2A and FIG. 2B includes a plurality of the memory devices 10 shown in FIG. 1A and FIG. 1B, and these memory devices 10 are connected to one another through a plurality of the read word lines RWL, a plurality of the write word lines WWL and a plurality of the bit lines BL. It should be noted that, the MTJs 100 and the conductive patches 106 of the memory devices 10 are omitted from illustration. A terminal of the write selector 102 and a terminal of the read selector 104 in each memory device 10 should be connected to one of the bit lines BL through the corresponding MTJ 100 and conductive patch 106 (not shown in FIG. 2A and FIG. 2B). In addition, another terminal of the write selector 102 in each memory device 10 is connected to one of the write word lines WWL, and another terminal of the read selector 104 in each memory device 10 is connected to one of the read word lines RWL. In some embodiments, the memory devices 10 are arranged as an array having multiple rows and multiple columns. The memory devices 10 in the same row may share one of the write word lines WWL and one of the read word line RWL. In addition, the memory devices 10 in the same column may share one of the bit lines BL.

As shown in FIG. 2A, during a read operation, the bit lines BL are electrically disconnected from the write word lines WWL by keeping the write selectors 102 off. Thereby, the write word lines WWL are depicted as dash lines as shown in FIG. 2A. On the other hand, the bit lines BL are electrically connected to the read word lines RWL since the read selectors 104 connected in between are switched on, and the read word lines RWL are depicted in solid lines as shown in FIG. 2A. In some embodiments, a direct read operation is applied to the memory circuit 20, and the MTJ 100 (not shown) in one of the memory devices 10 can be read in each direct read operation. During the direct read operation, one of the read word lines RWL being selected (labeled as a write word line RWL') is configured to receive the read voltage VR, and one of the bit lines BL being selected (labeled as a bit line BL') is configured to receive the reference voltage VG (e.g., ground voltage). In this way, the read selector 104 connected between the selected read word line RWL' and the selected bit line BL' can be switched on, such that the read path RP (shown in FIG. 1A) is established. Accordingly, current may pass through the MTJ 100 (not shown in FIG. 2A) connected between the selected read word line RWL' and bit line BL', and may be detected by a sense amplifier (not shown) for identifying the resistance state of the selected MTJ 100 (not shown in FIG. 2A). On the other hand, as described with reference to FIG. 1A, the write word line WWL connected to the selected memory device 10 may receive a voltage that can ensure isolation between this write word line WWL and the selected bit line BL by keeping the write selector 102 therebetween in an off state. Moreover, unselected read word lines RWL, remainder of the write word lines WWL and unselected bit lines BL may receive the same voltage, such that the corresponding write selectors 102 and read selectors 104 can be kept in an off state. Accordingly, formation of sneak current and/or accidentally programming the unselected memory devices 10 can be avoided. As shown in an example illustrated in FIG. 2A, all of the write word lines WWL, the unselected read word lines RWL and the unselected bit lines BL may receive a voltage substantially equal to half of the read voltage VR (i.e., VR/2) during the direct read operation.

In alternative embodiments, a parallel read operation is applied to the memory circuit 20, and a plurality of memory devices 10 connected to one of the read word lines RWL can be read in each parallel read operation. During a parallel read operation, one of the read word lines RWL being selected is configured to receive the read voltage VR, and at least some of the bit lines BL are configured to receive the reference voltage VG. On the other hand, the write word line WWL connected to the selected row of memory devices 10 may receive a voltage that can ensure isolation between this write word lines WWL and the selected MTJs 100 by keeping the selectors 104 therebetween in an off state. As an example, this write word line WWL receives a voltage substantially equal to half of the read voltage VR (i.e., VR/2) during the parallel read operation. Moreover, unselected read word lines RWL and remainder of the write word lines WWL may receive the reference voltage VG. Alternatively, the unselected read word lines RWL and remainder of the write word lines WWL may be electrically floated.

As shown in FIG. 2B, during a write operation, the bit lines BL are electrically disconnected from the read word lines RWL by keeping the read selectors 104 off. Thereby, the read word lines RWL are depicted as dash lines as shown in FIG. 2B. On the other hand, the bit lines BL are electrically connected to the write word lines WWL since the write selectors 102 connected in between is switched on, and the write word lines WWL are depicted in solid lines as shown in FIG. 2B. In some embodiments, a direct write operation is applied to the memory circuit 20, and the MTJ 100 (not shown) in one of the memory devices 10 can be programmed in each direct write operation. During the direct write operation, one of the write word lines WWL being selected (labeled as a write word line WWL') is configured to receive the write voltage VP, and one of the bit lines BL being selected (labeled as a bit line BL') is configured to receive the reference voltage VG (e.g., ground voltage). In this way, the write selector 102 connected between the selected write word line WWL' and the selected bit line BL' can be switched on, such that current passes through the MTJ 100 (not shown) of the memory device 10 connected to the selected write word line WWL' and bit line BL', and this MTJ 100 (not shown) can be programmed by the STT effect. On the other hand, as described with reference to FIG. 1B, the read word line RWL connected to the selected memory device 10 may receive a voltage (e.g., half of the write voltage VP/2) that can prevent from turning on the read selector 104, thus formation of sneak current can be avoided. Moreover, unselected write word lines WWL, remainder of the read word lines RWL and unselected bit lines BL may receive the same voltage, such that the corresponding write selectors 102 and read selectors 104 can be kept in an off state. Accordingly, formation of sneak current and/or accidentally programming the unselected memory devices 10 can be avoided. As shown in an example illustrated in FIG. 2B, all of the write word lines WWL, the unselected read word lines RWL and the unselected bit lines BL may receive a voltage substantially equal to half of the write voltage VP (i.e., VP/2) during the direct write operation.

In alternative embodiments, a parallel write operation may be applied to the memory circuit 20, and multiple memory devices 10 may be programmed in each time. In these embodiments, one of the write word lines WWL is selected and configured to receive the write voltage VP, and at least some of the bit lines BL are selected and configured to receive the reference voltage VG (e.g., ground voltage). On the other hand, as similar to the direct write operation, the read word lines RWL connected to the selected memory device 10 may receive a voltage (e.g., half of the write voltage VP/2) that can keep the read selector 104 of the selected memory device 10 in an off state. In addition, unselected write word lines WWL, remainder of the read word lines RWL and unselected bit lines BL (if any) may receive the same voltage, such that the corresponding write selectors 102 and read selectors 104 can be kept in an off state. In certain cases, a data pattern can be programmed into the MTJs 100 (not shown) of the memory devices 10 connected to one of the write word lines WWL by performing two parallel write operations. During a first parallel write operation, all of the MTJs 100 (not shown) of the memory devices 10 connected to the selected write word line WWL may be programmed with the same logic data (e.g., logic "0"). During a second parallel write operation, some of these previously programmed memory devices 10 may be selected, and the MTJs 100 (not shown) thereof are currently programmed with another logic data (e.g., logic "1") complementary to the logic data (e.g., logic "0") written in the first parallel write operation. In this way, a data pattern including complementary logic data (e.g., logic "1" and logic "0") can be programmed into the memory devices 10 connected to the selected write word line WWL. However, those skilled in the art may apply other suitable write operation for programming the memory devices 10 according to design requirements, the present disclosure is not limited thereto.

FIG. 3A through FIG. 3D are schematic cross-sectional views illustrating the write/read selectors 102/104 according to some embodiments of the present disclosure.

Figure 3A:
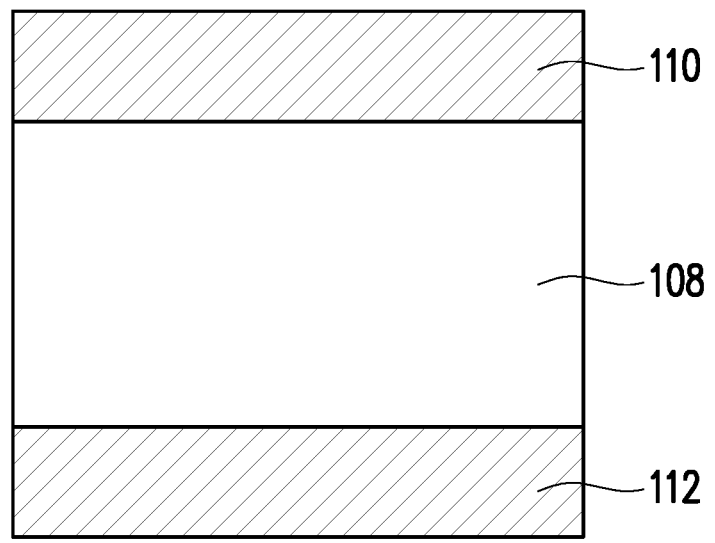
FIG. 3A through FIG. 3D are schematic cross-sectional views illustrating write/read selectors according to some embodiments of the present disclosure.

Referring to FIG. 3A, the write/read selector 102/104 may be a threshold-type selector. In some embodiments, the threshold-type selector is an ovonic threshold switch (OTS) selector. In these embodiments, the write/read selector 102/104 includes an OTS layer 108 sandwiched between top and bottom conductive layers 110, 112. The OTS layer 108 exhibits a rapid and reversible transition between a high resistance state (off state) and a low resistance state (on state) in response to a bias voltage applied to the OTS layer 108, and such bias voltage can be a positive bias voltage or a negative bias voltage. The OTS layer 108 may include a binary material, a ternary material or a quadruple material. For instance, the binary material may include SiTe, GeTe, CTe, BTe, ZnTe, AlTe, GeSe, GeSb, SeSb, SiAs, GeAs, AsTe, BC or the like, and the binary material may or may not be doped with nitrogen or oxygen. The ternary material may include GeSeAs, GeSeSb, GeSbTe, GeSiAs, GeAsSb, SeSbTe, SiTeSe or the like, and the ternary material may or may not be doped with nitrogen, oxygen or carbon. The quadruple material may include GeSeAsTe, GeSeTeSi, GeSeTeAs, GeTeSiAs, GeSeAsSb, GeSeSbSi or the like, and the quadruple material may or may not be doped with nitrogen, oxygen or carbon. In addition, materials of the conductive layers 110, 112 may respectively include Ta, Ti, TaN, TiN, Ru, the like or combinations thereof. As described with reference to FIG. 1A and FIG. 1B, the read selector 104 is formed as having a relatively low turn-on voltage, whereas the write selector 102 is formed as having a relatively high turn-on voltage. The turn-on voltage of the write/read selector 102/104 may be determined by bandgap of the OTS layer 108 and/or work function of the conductive layers 110, 112. Larger bandgap of the OTS layer 108 and/or higher work function of the conductive layers 110, 112 may result in higher turn-on voltage of the write/read selector 102, 104. Accordingly, the OTS layer 108 of the write selector 102 may have a larger bandgap than the OTS layer 108 of the read selector 104, and/or the conductive layers 110, 112 of the write selector 102 may have a higher work function than the conductive layers 110, 112 of the read selector 104. However, those skilled in the art may select materials of the OTS layer 108 and the conductive layers 110, 112 according to other design rules, or adjusting turn-on voltage of the write and read selectors 102, 104 formed of identical materials by possible methods (e.g., an implantation process), as long as the obtained write selector 102 has a turn-on voltage higher than a turn-on voltage of the obtained read selector 104.

Figure 3B:
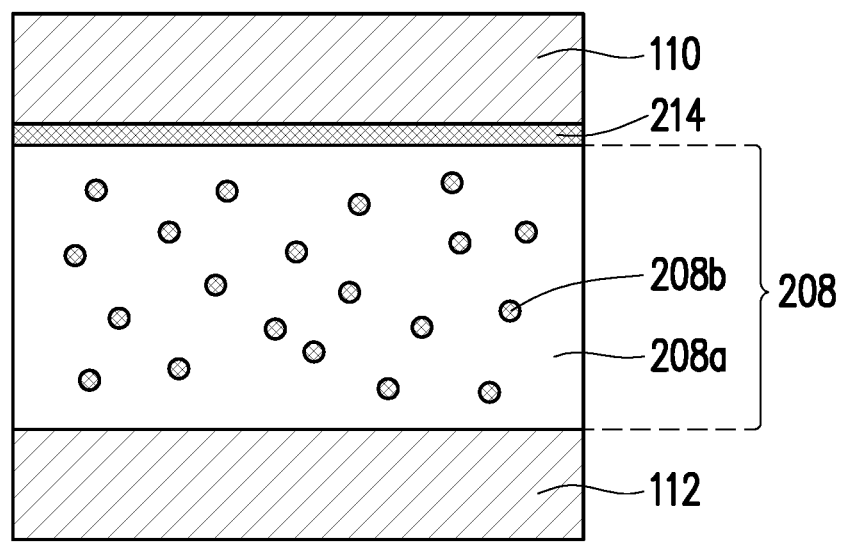

Referring to FIG. 3B, in some embodiments, the threshold-type selector is a conductive bridge (CB) selector, which may also be referred as a voltage conductive bridge (VCB) selector. In these embodiments, the OTS layer 108 as shown in FIG. 3A is replaced by a switching layer 208. The switching layer 208 may include a solid electrolyte 208a and ions 208b spreading in the solid electrolyte 208a. For instance, the solid electrolyte 208a may include hafnium oxide, and the ions 208b may include Ag ions, Cu ions, Al ions, As ions, Te ions, the like or combinations thereof. When a voltage difference of the conductive layers 110, 112 exceeds a threshold voltage of the write/read selector 102/104, the ions 208b are localized, and a conductive path (or referred as a conductive filament) is formed in the solid electrolyte 208a and connecting between the conductive layers 110, 112. As such, the write/read selector 102/104 can be switched on. On the other hand, the ions 208b are delocalized when a proper bias voltage across the write/read selector 102/104 is absent, and the conductive path is cut off in the solid electrolyte 208a. Accordingly, the write/read selector 102/104 is in an off state. In some embodiments, the ions 208b may be provided by a reservoir layer 214 disposed between the switching layer 208 and one of the conductive layers 110, 112 (e.g., between the switching layer 208 and the conductive layer 110). For instance, a material of the reservoir layer 214 may include Ag, Cu, Al, As, Te, the like or combinations thereof. In alternative embodiments, the ions 208b may be provided by an implantation process performed on the solid electrolyte 208a. In these alternative embodiments, the reservoir layer 214 may or may not be omitted. As similar to the description with reference to FIG. 3A, the write and read selectors 102, 104 can be formed that the write selector 102 has a turn-on voltage higher than a turn-on voltage of the read selector 104 by selecting materials for the solid electrolyte 208a and/or the conductive layers 110, 112 according to bandgap of the solid electrolyte 208a and/or the work function of the conductive layers 110, 112. In some embodiments, the solid electrolyte 208a of the write selector 102 may have a larger bandgap than the solid electrolyte 208a of the read selector 104, and/or the conductive layers 110, 112 of the write selector 102 may have a higher work function than the conductive layers 110, 112 of the read selector 104. However, those skilled in the art may select materials of the solid electrolyte 208a and the conductive layers 110, 112 according to other design rules, or adjusting turn-on voltage of the write and read selectors 102, 104 formed of identical materials by possible methods (e.g., an implantation process), as long as the obtained write selector 102 has a turn-on voltage higher than a turn-on voltage of the obtained read selector 104.

Figure 3C:
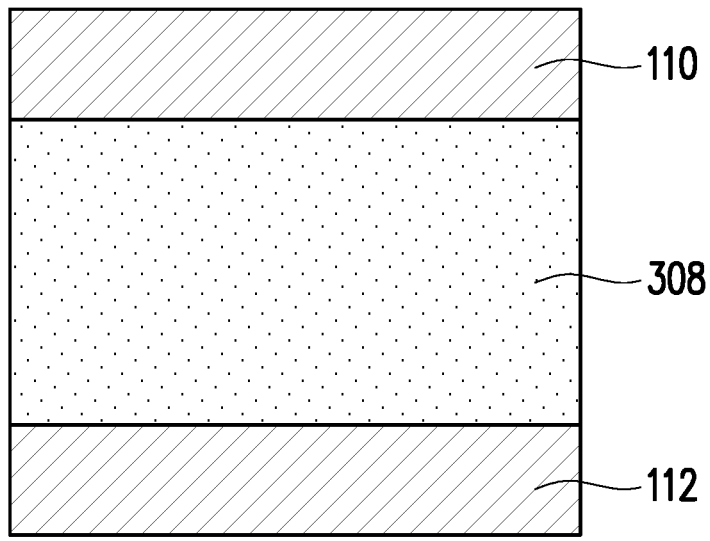

Referring to FIG. 3C, in some embodiments, the write/read selector 102/104 may be an exponential-type selector. In these embodiments, the OTS layer 106 as shown in FIG. 3A is replaced by a tunneling layer 308. Given a fixed thickness of the tunneling layer 308, carriers may tunnel through the tunneling layer 308 by controlling a bias voltage of the tunneling layer 308. This tunneling behavior can be explained by, for example, direct tunneling effect or Fowler-Nordheim tunneling (FN tunneling) effect. Once the tunneling of carriers is formed between the conductive layers 110, 112, the write/read selector 102/104 is turned on. Otherwise, the write/read selector 102/104 is in an off state. In some embodiments, a material of the tunneling layer 308 may include titanium oxide, tantalum oxide, nickel oxide or the like. In certain embodiments, the tunneling layer 308 is a multilayer structure including, for example, a TiN layer and a Si layer. As similar to the description with reference to FIG. 3A, the write and read selectors 102, 104 can be formed that the write selector 102 has a turn-on voltage higher than a turn-on voltage of the read selector 104 by selecting materials for the tunneling layer 308 and/or the conductive layers 110, 112 according to bandgap of the tunneling layer 308 and/or the work function of the conductive layers 110, 112. In some embodiments, the tunneling layer 308 of the write selector 102 may have a larger bandgap than the tunneling layer 308 of the read selector 104, and/or the conductive layers 110, 112 of the write selector 102 may have a higher work function than the conductive layers 110, 112 of the read selector 104. However, those skilled in the art may select materials of the tunneling layer 308 and the conductive layers 110, 112 according to other design rules, or adjusting turn-on voltage of the write and read selectors 102, 104 formed of identical materials by possible methods (e.g., an implantation process), as long as the obtained write selector 102 has a turn-on voltage higher than a turn-on voltage of the obtained read selector 104.

Figure 3D:
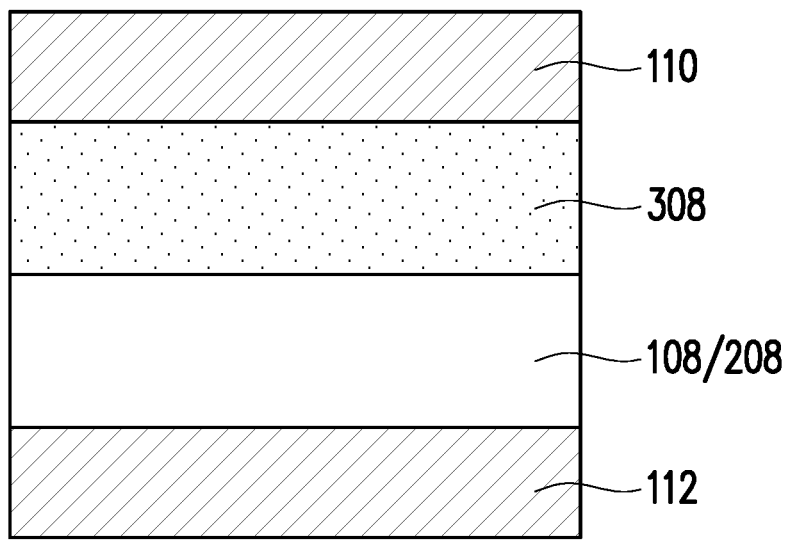

Referring to FIG. 3D, in yet other embodiments, the write/read selector 102/104 is a mixed-type selector having a threshold characteristic of a threshold-type selector described with reference to FIG. 3A, FIG. 3B and an exponential characteristic of the exponential-type selector as described with reference to FIG. 3C. As shown in FIG. 3D, the write/read selector 102/104 includes the OTS layer 108 (shown in FIG. 3A) or the switching layer 208 (shown in FIG. 3B) of a threshold-type selector, and further includes the tunneling layer 308 (shown in FIG. 3C) of an exponential-type selector. As shown in FIG. 3D, the OTS layer 108 or the switching layer 208 is closer to the bottom conductive layer 112, whereas the tunneling layer 308 is closer to the top conductive layer 110. However, stacking sequence of the OTS layer 108/switching layer 208 and the tunneling layer 308 can be reversed. In addition, when the write/read selector 102/104 includes the switching layer 208 and the tunneling layer 308, the write/read selector 102/104 may or may not further include the reservoir layer 214 (shown in FIG. 3B) between the switching layer 208 and the closest conductive layer (e.g., the bottom conductive layer 112). Furthermore, as described with reference to FIG. 3A through FIG. 3C, materials for the write selector 102 and the read selector 104 can be selected that the write selector 102 could have a turn-on voltage higher than a turn-on voltage of the read selector 104.

FIG. 4A through FIG. 4D are schematic cross-sectional views illustrating memory devices 10a, 10b, 10c and 10d according to some embodiments of the present disclosure. These memory devices 10a, 10b, 10c and 10d are similar to the memory device 10 as shown in FIG. 1A or FIG. 1B. Only difference therebetween will be described, the same or the like parts would not be repeated again.

Figure 4A:
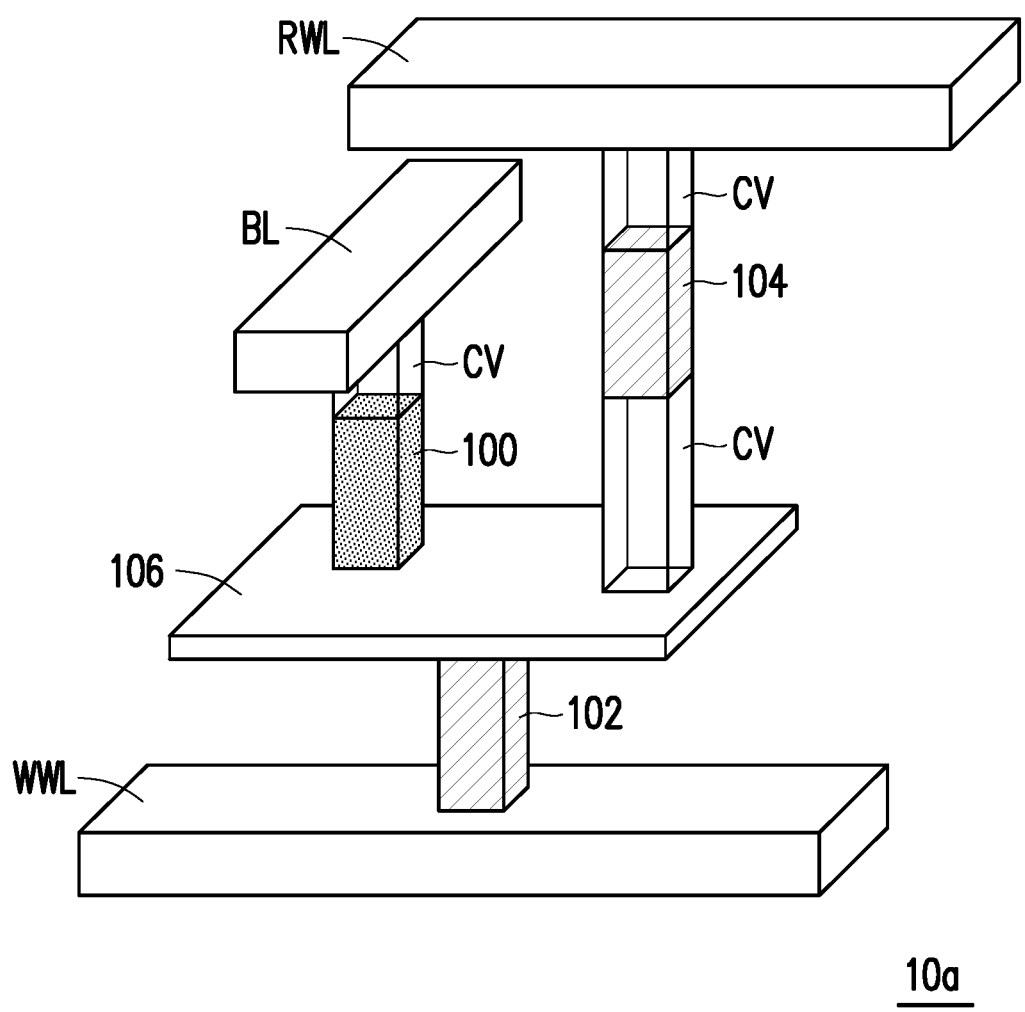
FIG. 4A through FIG. 4D are schematic cross-sectional views illustrating memory devices according to some embodiments of the present disclosure.

Referring to FIG. 4A, in some embodiments, another conductive via CV is disposed between the read selector 104 and the read word line RWL. This conductive via CV is physically and electrically connected to the overlying read word line RWL and the underlying read selector 104. Regarding manufacturing of the read selector 104 and the overlying and underlying conductive vias CV, material layers (not shown) for forming the read selector 104 and conductive layers (not shown) for forming these conductive vias CV may be patterned simultaneously, and a lithography process and one or more etching processes may be performed during this patterning step. In this way, a sidewall of the read selector 104 and sidewalls of the overlying and underlying conductive vias CV may be substantially coplanar with one another. In addition, the read selector 104 and the overlying and underlying conductive vias CV may collectively be regarded as a pillar structure, and this pillar structure may or may not be tapered downwardly (e.g., tapered toward the conductive patch 106). Alternatively, the read selector 104 and the overlying and underlying conductive vias CV may be patterned separately, and sidewalls of the read selector 104 and these conductive vias CV may or may not be coplanar with one another.

Figure 4B:
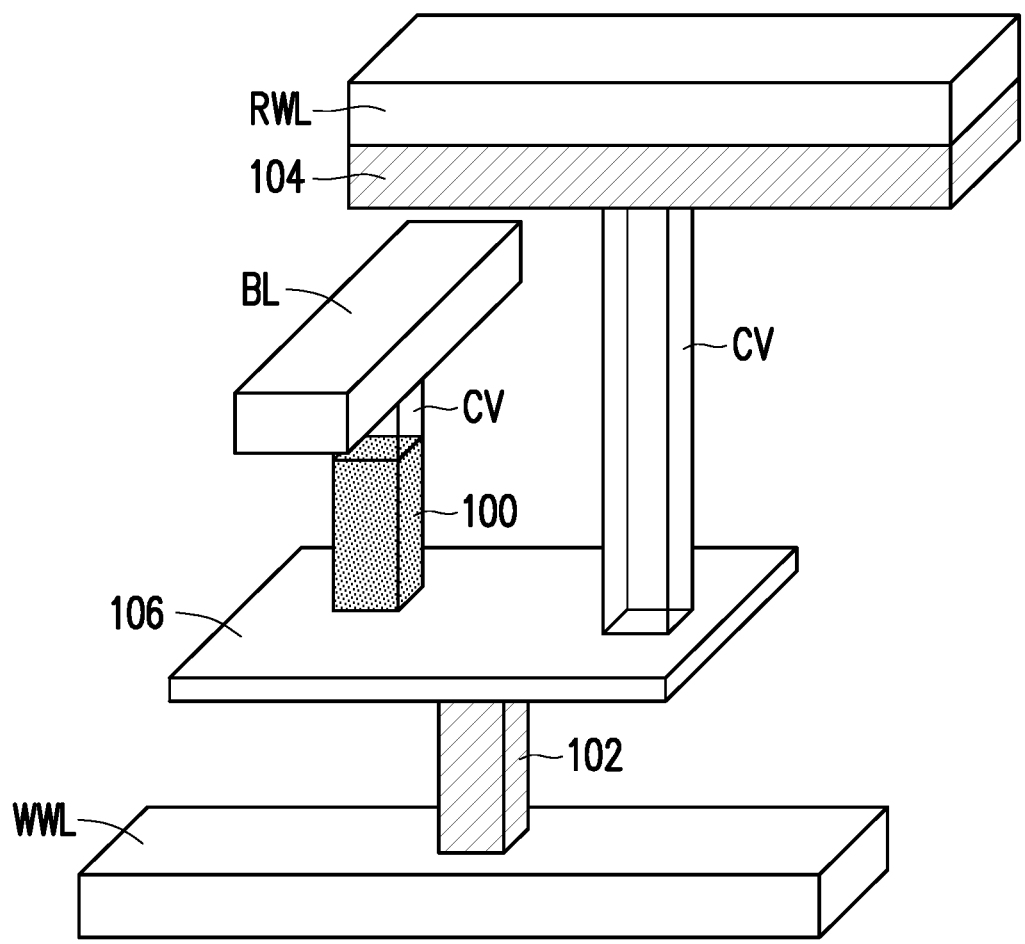

Referring to FIG. 4B, in some embodiments, the read selector 104 is formed in a line shape, and a conductive via may be absent between the read selector 104 and the read word line RWL. In addition, the line-shaped read selector 104 is connected to the conductive patch 106 through one of the conductive vias CV. In some embodiments where the read word line RWL is disposed above the conductive patch 106, the line-shaped read selector 104 is extending below the read word line RWL, and the line-shaped read selector 104 and the read word line RWL may extend along the same direction. In some embodiments, a conductive layer (not shown) for forming the read word line RWL and material layers (not shown) for forming the line-shaped read selector 104 may be patterned simultaneously, and a lithography process and one or more etching processes may be performed during this patterning step. In this way, a sidewall of the line-shaped read selector 104 may be substantially coplanar with a sidewall of the read word line RWL. In addition, the conductive via CV connected to the line-shaped read selector 104 may be formed before formation of the line-shaped read selector 104 and the read line RWL.

Figure 4C:
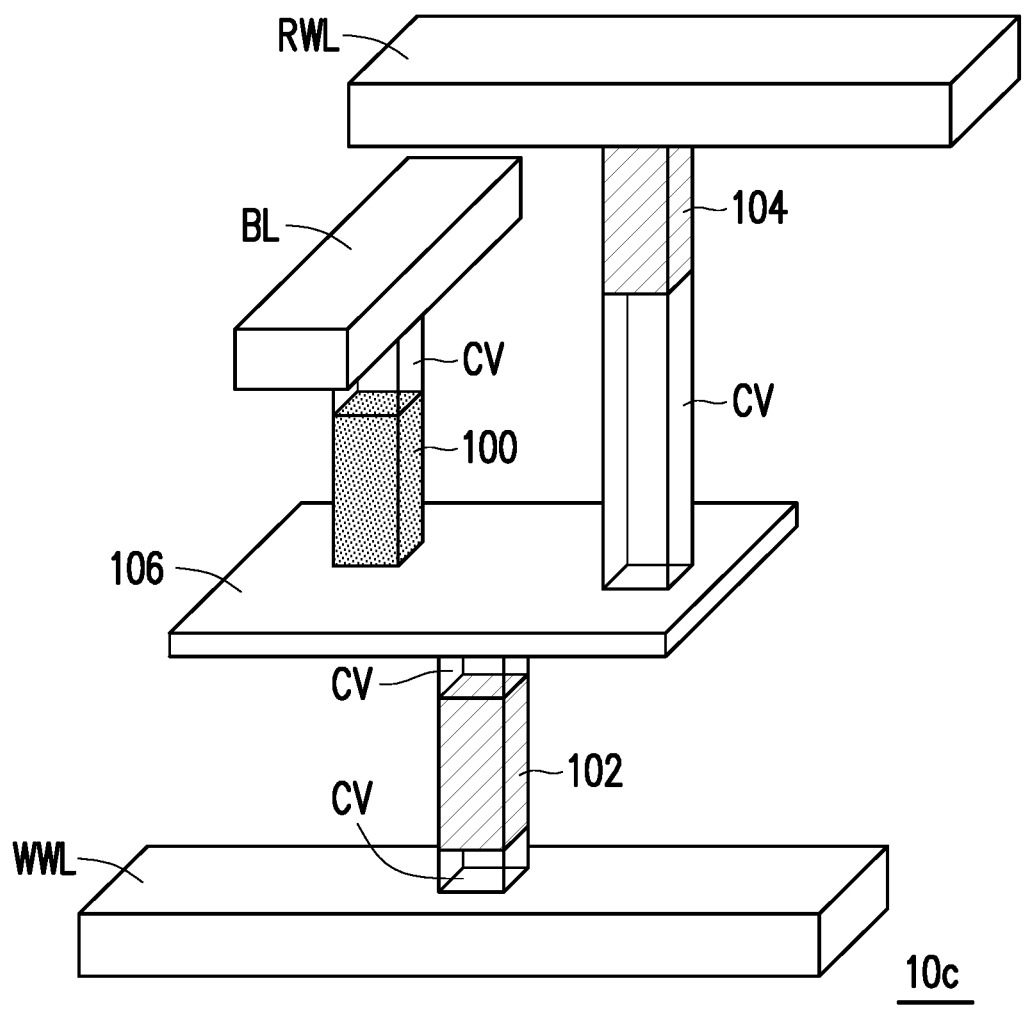

Referring to FIG. 4C, in some embodiments, the write selector 102 is connected to the write word line WWL and the conductive patch 106 by additional conductive vias CV, respectively. One of these additional conductive vias CV is physically and electrically connected between the write selector 102 and the write word line WWL, whereas the other one of these additional conductive vias CV is physically and electrically connected between the write selector 102 and the conductive patch 106. Regarding manufacturing of the write selector 102 and the overlying and underlying conductive vias CV, material layers (not shown) for forming the write selector 102 and conductive layers (not shown) for forming these conductive vias CV may be patterned simultaneously, and a lithography process and one or more etching processes may be performed during this patterning step. In this way, a sidewall of the write selector 102 and sidewalls of the overlying and underlying conductive vias CV may be substantially coplanar with one another. In addition, the write selector 102 and the overlying and underlying conductive vias CV may collectively be regarded as a pillar structure, and this pillar structure may or may not be tapered downwardly (e.g., tapered toward the write word line WWL). Alternatively, the write selector 102 and the overlying and underlying conductive vias CV may be patterned separately, and sidewalls of the write selector 102 and these conductive vias CV may or may not be coplanar with one another.

In alternative embodiments, one of the conductive vias CV connected to the write selector 102 may be omitted. In these embodiments, the write selector 102 may be connected to one of the write word line WWL and the conductive patch 106 without a conductive via in between, while connected to the other one of the write word line WWL and the conductive patch 106 through one of the conductive vias CV.

Figure 4D:
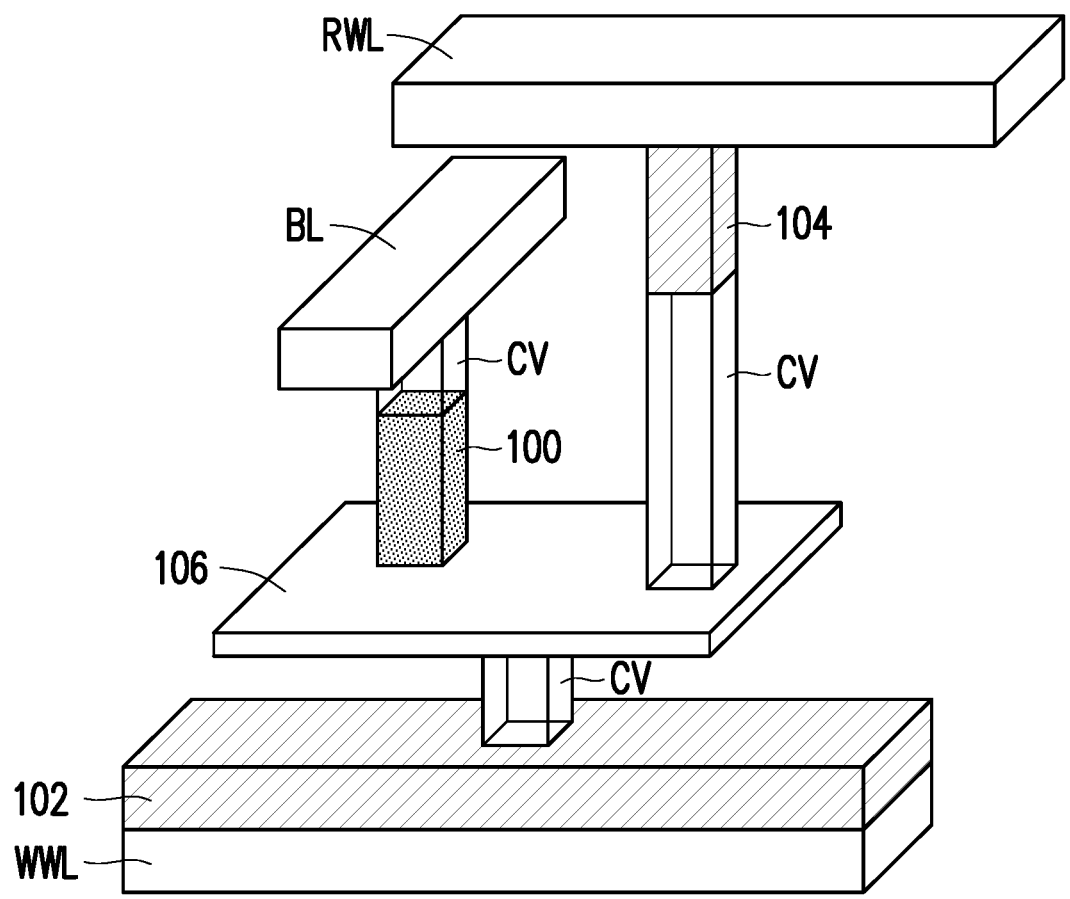

Referring to FIG. 4D, as similar to the read selector 104 as described with reference to FIG. 4B, the write selector 102 is formed in a line shape according to some embodiments. In these embodiments, a conductive via may be absent between the write selector 102 and the write word line WWL. In addition, the line-shaped write selector 102 is connected to the conductive patch 106 through a conductive via CV. In some embodiments where the write word line WWL is disposed below the conductive patch 106, the line-shaped write selector 102 is extending on the write word line WWL, and the line-shaped write selector 102 and the write word line WWL may extend along the same direction. Regarding manufacturing the architecture shown in FIG. 4D, a conductive layer (not shown) for forming the write word line WWL and material layers (not shown) for forming the line-shaped write selector 102 may be patterned simultaneously, and a lithography process and one or more etching processes may be performed during this patterning step. In this way, a sidewall of the line-shaped write selector 102 may be substantially coplanar with a sidewall of the write word line WWL. In addition, the conductive via CV connected to the line-shaped write selector 102 may be formed after formation of the line-shaped read selector 102 and the write line WWL.

Figure 5A:
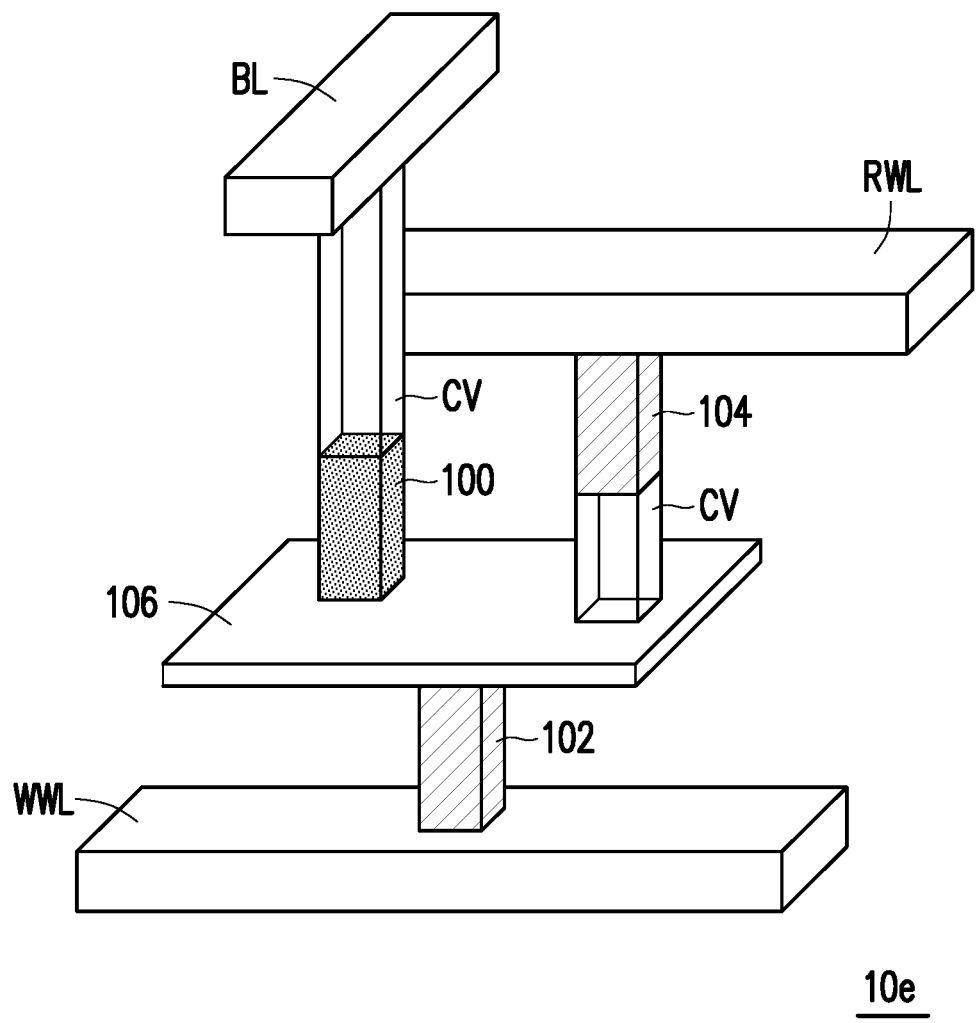
FIG. 5A and FIG. 5B are schematic three-dimensional view illustrating memory devices according to some embodiments of the present disclosure.
Figure 5B:
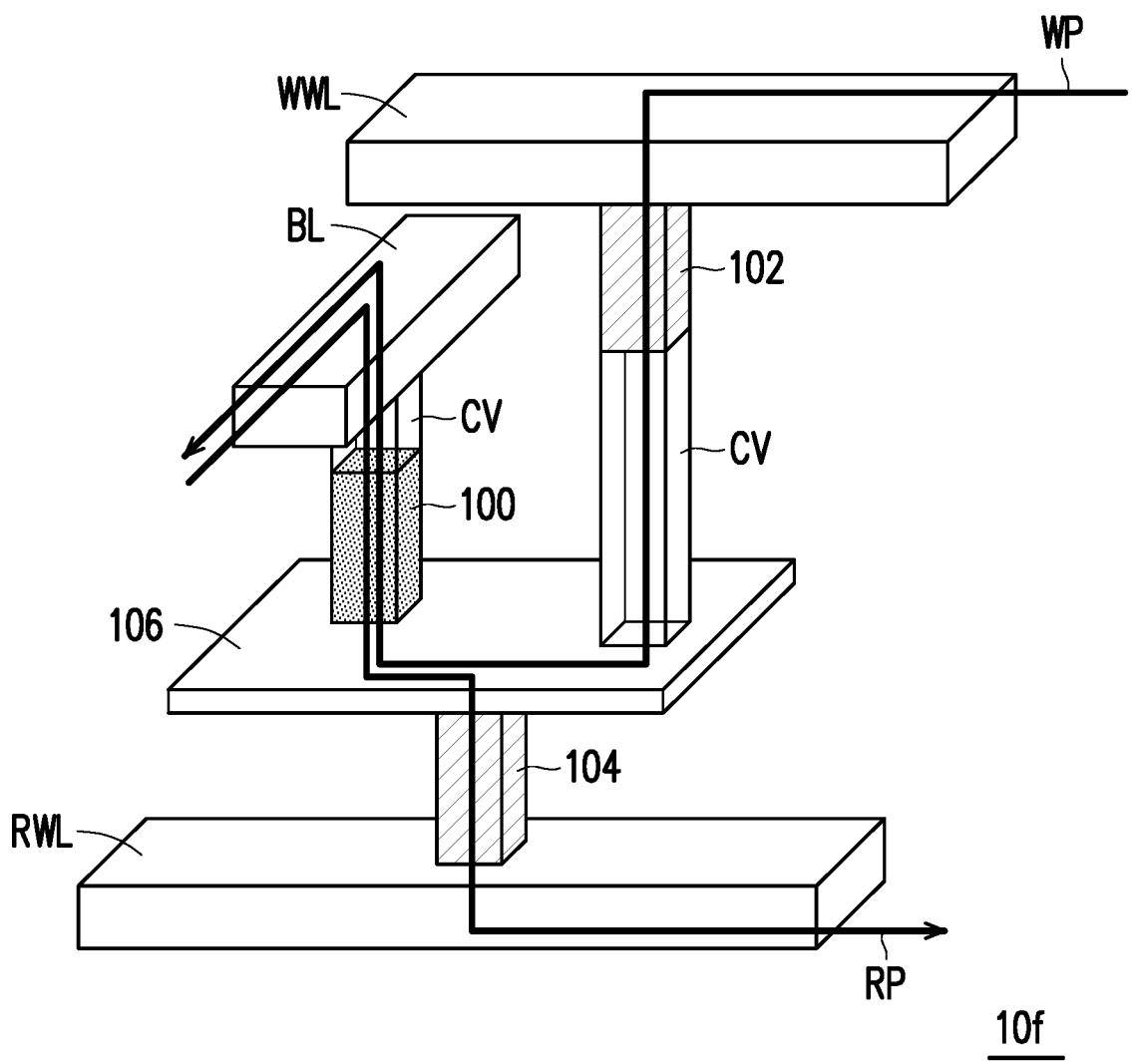

FIG. 5A and FIG. 5B are schematic three-dimensional view illustrating memory devices 10e, 10f according to some embodiments of the present disclosure. These memory devices 10e, 10f are similar to the memory device 10 as shown in FIG. 1A or FIG. 1B. Only difference therebetween will be described, the same or the like parts would not be repeated again.

Referring to FIG. 5A, in some embodiments, the read word line RWL extends below the bit line BL. Vertical lengths of the conductive vias CV connected to the read word line RWL and the bit line BL may be adjusted that the vertical length of the conductive via CV connected to the bit line BL may be greater than the vertical length of the conductive via CV connected to the read word line RWL, so as to comply with the architecture shown in FIG. 5A.

Referring to FIG. 5B, in some embodiments, the read word line RWL and the read selector 104 are connected to the conductive patch 106 from below the conductive patch 106. On the other hand, the write word line WWL and the write selector 102 are connected to the conductive patch 106 from above the conductive patch 106, along with the MTJ 100 and the bit line BL. In this way, the read path RP passing through the bit line BL, the MTJ 100, the conductive patch 106, the read selector 104 and the read word line RWL is from a side (e.g., a top side) of the conductive patch 106 to another side (e.g., a bottom side) of the conductive patch 106, whereas the write path WP passing through the write word line WWL, the write selector 102, the conductive patch 106, the MTJ 100 and the bit line BL is at a single side (e.g., a top side) of the conductive patch 106. In some embodiments, as shown in FIG. 5B, the write selector 102 is connected to the conductive patch 106 through a conductive via CV, while connected to the write word line WWL without a conductive via in between. In alternative embodiments, an additional conductive via is disposed between the write selector 102 and the write word line WWL, or the write selector 102 may be formed in a line shape. On the other hand, as shown in FIG. 5B, the read selector 104 may be connected to the conductive patch 106 and the read word line RWL without a conductive via in between. Alternatively, a conductive via may be disposed between the read selector 104 and the conductive patch 106, and/or a conductive via may be disposed between the read selector 104 and the read word line RWL. In addition, the read selector 104 may be formed in a ling shape, and connected to the conductive patch 106 through a conductive via.

Figure 6:
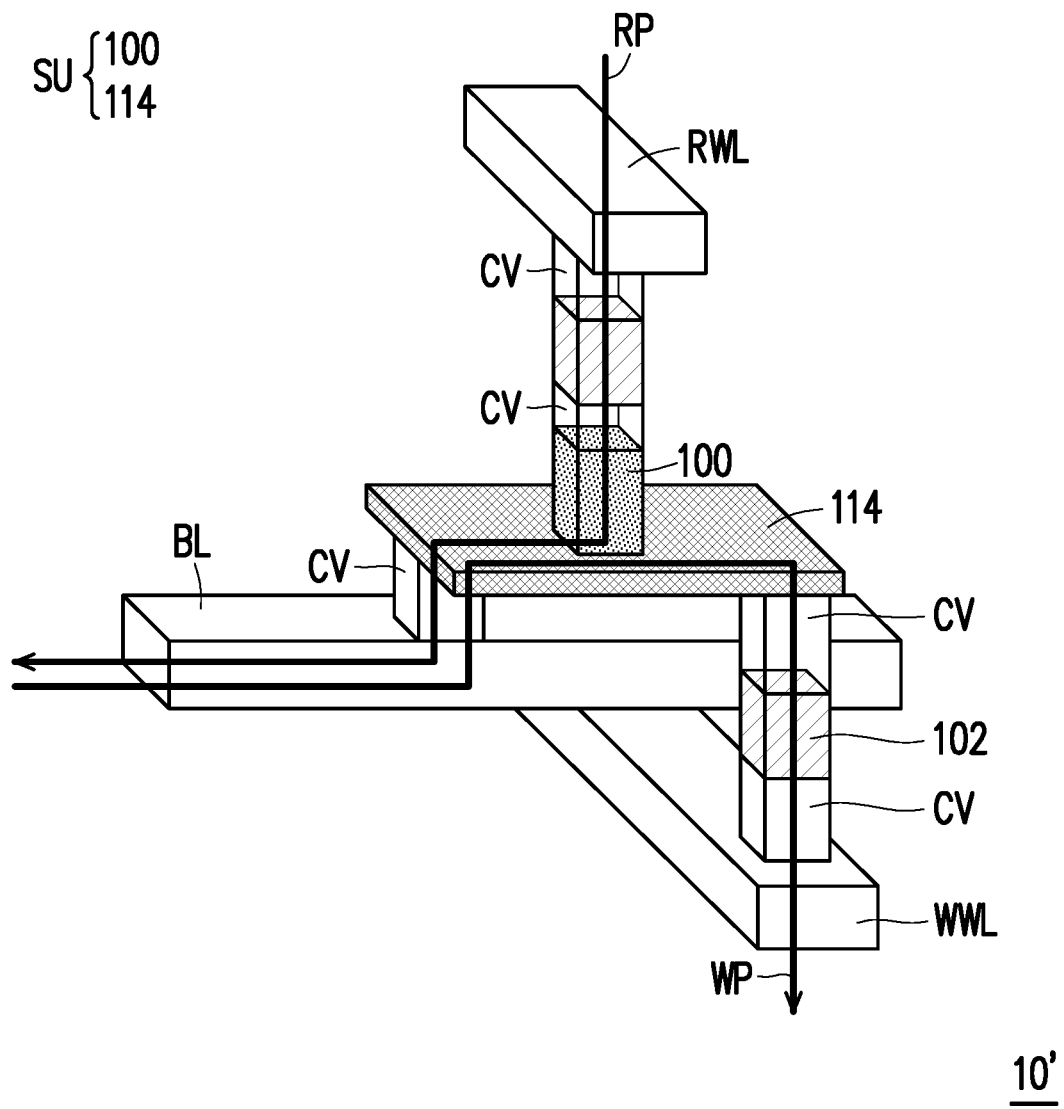
FIG. 6 is a schematic three-dimensional view illustrating a memory device according to some embodiments of the present disclosure.

FIG. 6 is a schematic three-dimensional view illustrating a memory device 10' according to some embodiments of the present disclosure. The memory devices 10' is similar to the memory device 10 as shown in FIG. 1A or FIG. 1B. Only difference therebetween will be described, the same or the like parts would not be repeated again.

Referring to FIG. 6, in some embodiments, the memory device 10' is a spin-orbit torque (SOT) MRAM device. In these embodiments, a magnetoresistive unit SU of the memory device 10' includes the MTJ 100 and a SOT layer 114, which may be made of a heavy metal (e.g., W, Pt, Ta, Co, Fe, Ni, Cu, Pt, the like or combinations thereof), a topological insulator (e.g., $Bi_2Se_3$, or MgO) or other suitable materials. The MTJ 100 stands on the SOT layer 114. A terminal of the MTJ 100 is connected to the read word line RWL with the read selector 104 connected in between, and another terminal of the MTJ 100 is connected to the SOT layer 114. In addition, the write word line WWL and the bit line BL are connected to the SOT layer 114. The write selector 102 is connected between the SOT layer 114 and the write word line WWL. In some embodiments, a portion of the SOT layer 114 on which the MTJ 100 stands is located between portions of the SOT layer 114 to which the bit line BL and the write selector 102 are respectively connected. For instance, the SOT layer 114 may be formed as a rectangular conductive patch, and the bit line BL and the write selector 102 may be connected to diagonal corners of this rectangular conductive patch. During a read operation, the read selector 104 is configured to be turned on, and a read path RP' passing between the read word line RWL and the bit line BL through the read selector 104, the MTJ 100 and the SOT layer 114 is established. The current along the read path RP' can be detected by a sense amplifier (not shown), and a resistance state of the MTJ 100 can be identified. In addition, during a read operation, the write selector 102 is kept in an off state (e.g., by ensuring that a voltage difference between the SOT layer 114 and the write word line WWL is low enough not to turn on the write selector 102), so as to avoid from formation of an in-plane current flowing through the SOT layer 114 between the write word line WWL and the bit line BL. In this way, the MTJ 100 can be prevented from being accidentally programmed during a read operation. During a write operation, the write selector 102 is configured to be switched on, and a write path WP' can be established between the write word line WWL and the bit line BL. In this way, an in-plane current passes through the SOT layer 114, and consequently formed SOT induces switching of the free layer (not shown) in the MTJ 100. As such, the MTJ 100 can be programmed during a write operation. In addition, the read selector 104 is configured to be kept in an off state during a write operation (e.g., by ensuring that a voltage difference across the read selector 104 is low enough not to turn on the read selector 104), such that formation of sneak current (i.e., current from the SOT layer 114 to the read word line RWL) during a write operation can be prevented.

As similar to the description with reference to FIG. 1A and FIG. 1B, the read path RP' and the write path WP' of the SOT MRAM device shown in FIG. 6 can be separately controlled by disposing the read selector 104 on the read path RP' and disposing the write selector 102 on the write path WP'. In this way, read operation and write operation of the SOT MRAM device can be individually optimized without compromising one of these operations for improving another. Furthermore, by disposing the read selector 104 with a lower turn-on voltage and disposing the write selector 102 with a higher turn-on voltage, a read margin of the MTJ 100 can be less reduced without compromising suppression of write disturbance and/or read disturbance.

In some embodiments, as shown in FIG. 6, the read selector 104 is connected to the MTJ 100 and the read word line RWL respectively through a conductive via CV, and the write selector 102 is connected to the SOT layer 114 and the write word line WWL respectively through a conductive via CV. In addition, the bit line BL may be connected to the SOT layer 114 through a conductive via CV. In alternative embodiments, at least one of the conductive vias CV connected to the read selector 104 may be omitted. Similarly, at least one of the conductive vias CV connected to the write selector 102 may be omitted. Moreover, in some embodiments, the read selector 104 and the write selector 102 are respectively formed as a pillar structure. In alternative embodiments, at least one of the read selector 104 and the write selector 102 may be formed in a line shape as described with reference to FIG. 4B and FIG. 4D. Furthermore, according to the embodiments shown in FIG. 6, the bit line BL and the write word line WWL are connected to SOT layer 114 from below the SOT layer 114, whereas the MTJ 100 and the read word line RWL are connected to the SOT layer 114 from above the SOT layer 114. In alternative embodiments, one of the bit line BL and the write word line WWL is connected to the SOT layer 114 from above the SOT layer 114, whereas the other one of the bit line BL and the write word line WWL is connected to the SOT layer 114 from below the SOT layer 114.

As above, a memory device and a memory circuit including a plurality of the memory devices are provided. The memory device is a MRAM device, and includes a MTJ configured to be programmed by SOT or STT. A terminal of the MTJ is electrically connected to a bit line. On the other hand, another terminal of the MTJ is connected to a read word line through a read selector, and is connected to a write word line through a write selector. As such, the MTJ is in electrical contact with the read word line when the read selector is turned on, and is electrically disconnected from the read word line when the read selector is in an off state. Similarly, whether the MTJ is electrically connected to the write word line can be determined by a conductive state of the write selector. By disposing the read selector and the write selector, a write path and a read path of the memory device can be separately controlled. Therefore, write operation and read operation can be individually optimized without compromising one of these operations for improving another. In some embodiments, a turn-on voltage of the write selector is greater than a turn-on voltage of the read selector. In these embodiments, a read margin of the MTJ can be less degraded without compromising suppression of write disturbance and/or read disturbance.

In an aspect of the present disclosure, a memory device is provided. The memory device comprises: a magnetic tunnel junction (MTJ); a read word line, connected to the MTJ with a read selector in between, wherein the read word line is electrically connected to the MTJ when the read selector is turned on, and the read word line is electrically disconnected from the MTJ when the read selector is in an off state; and a write word line, connected to the MTJ with a write selector in between, wherein the write word line is electrically connected to the MTJ when the write selector is turned on, the write word line is electrically disconnected from the MTJ when the write selector is in an off state, and a turn-on voltage of the write selector is greater than a turn-on voltage of the read selector.

In another aspect of the present disclosure, a memory device is provided. The memory device comprises: a spin-orbit torque (SOT) layer; a magnetic tunnel junction (MTJ), standing on the SOT layer; a read word line, connected to the MTJ with a read selector in between, wherein the read word line is electrically connected to the MTJ when the read selector is turned on, and the read word line is electrically disconnected from the MTJ when the read selector is in an off state; and a write word line, connected to the SOT layer with a write selector in between, wherein the write word line is electrically connected to the SOT layer when the write selector is turned on, the write word line is electrically disconnected from the SOT layer when the write selector is in an off state, and wherein a turn-on voltage of the write selector is greater than a turn-on voltage of the read selector.

In yet another aspect of the present disclosure, a memory circuit is provided. The memory circuit comprises: magnetoresistive storage units, arranged as an array; read word lines, respectively connecting to a row of the magnetoresistive storage units through read selectors; write word lines, respectively connecting to a row of the magnetoresistive storage units through write selectors, wherein a turn-on voltage of the write selector is greater than a turn-on voltage of the read selectors; and bit lines, respectively connecting to a column of the magnetoresistive storage units.

It should be appreciated that the following embodiment(s) of the present disclosure provides applicable concepts that can be embodied in a wide variety of specific contexts. The embodiments are intended to provide further explanations but are not used to limit the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a magnetic tunnel junction (MTJ);
   a read word line, connected to the MTJ with a read selector in between, wherein the read selector is a two-terminal device with a terminal connected to the MTJ and the other terminal connected to the read word line, the read word line is electrically connected to the MTJ when the read selector is turned on, and the read word line is electrically disconnected from the MTJ when the read selector is in an off state; and
   a write word line, connected to the MTJ with a write selector in between, wherein the write selector is a two-terminal device with a terminal connected to the MTJ and the other terminal connected to the write word line, the write word line is electrically connected to the MTJ when the write selector is turned on, the write word line is electrically disconnected from the MTJ when the write selector is in an off state, and a turn-on voltage of the write selector is greater than a turn-on voltage of the read selector.

2. The memory device according to claim 1, wherein the read selector and the write selector are configured not to be turned on at the same time.

3. The memory device according to claim 1, wherein the selector is a threshold-type selector, an exponential-type selector or a mixed type selector having a threshold characteristic of the threshold-type selector and an exponential characteristic of the exponential-type selector.

4. The memory device according to claim 1, further comprising:
   a conductive patch, wherein the MTJ stands on the conductive patch, and the read selector and the write selector are connected to the conductive patch from opposite sides of the conductive patch.

5. The memory device according to claim 4, wherein the MTJ and the read selector are connected to the conductive patch from above the conductive patch, and the write selector is connected to the conductive patch from below the conductive patch.

6. The memory device according to claim 4, wherein the MTJ and the write selector are connected to the conductive patch from above the conductive patch, and the read selector is connected to the conductive patch from below the conductive patch.

7. The memory device according to claim 1, further comprising:
   a bit line, wherein a terminal of the MTJ is electrically connected to the bit line, and another terminal of the MTJ is electrically connected to the read selector and the write selector.

8. The memory device according to claim 1, wherein the read selector is in a line shape, the read selector and the read word line extend along the same direction, and a sidewall of the read selector is substantially coplanar with a sidewall of the read word line.

9. The memory device according to claim 1, wherein the write selector is in a line shape, the write selector and the write word line extend along the same direction, and a sidewall of the write selector is substantially coplanar with a sidewall of the write word line.

10. The memory device according to claim 1, wherein a current passes through the MTJ during a read operation and a write operation of the memory device.

11. A memory device, comprising:
    a spin-orbit torque (SOT) layer;
    a magnetic tunnel junction (MTJ), standing on the SOT layer;
    a read word line, connected to the MTJ with a read selector in between, wherein the read word line is electrically connected to the MTJ when the read selector is turned on, and the read word line is electrically disconnected from the MTJ when the read selector is in an off state; and
    a write word line, connected to the SOT layer with a write selector in between, wherein the write word line is electrically connected to the SOT layer when the write selector is turned on, the write word line is electrically disconnected from the SOT layer when the write selector is in an off state, and wherein a turn-on voltage of the write selector is greater than a turn-on voltage of the read selector.

12. The memory device according to claim 11, further comprising:
a bit line, electrically connected to the SOT layer, wherein a portion of the SOT layer on which the MTJ stands is located between a portion of the SOT layer to which the bit line is connected and a portion of the SOT layer to which the write word line is connected.

13. The memory device according to claim 12, wherein at least one of the bit line and the write word line extends below the SOT layer, and the MTJ and the read word line are located above the SOT layer.

14. The memory device according to claim 11, wherein the MTJ is configured to be programmed without a current passing through the MTJ.

15. A memory circuit, comprising:
magnetoresistive storage units, arranged as an array;
read word lines, respectively connecting to a row of the magnetoresistive storage units through read selectors, wherein each read selector is a two-terminal device with a terminal connected to one of the magnetoresistive storage units and the other terminal connected to one of the read word lines;
write word lines, respectively connecting to a row of the magnetoresistive storage units through write selectors, wherein each write selector is a two-terminal device with a terminal connected to one of the magnetoresistive storage units and the other terminal connected to one of the write word lines, and a turn-on voltage of the write selector is greater than a turn-on voltage of the read selectors; and
bit lines, respectively connecting to a column of the magnetoresistive storage units.

16. The memory circuit according to claim 15, wherein the read selector and the write selector connected to each of the magnetoresistive storage unit are configured not to be turned on at the same time.

17. The memory circuit according to claim 15, wherein each of the magnetoresistive storage unit comprises a magnetic tunnel junction (MTJ).

18. The memory circuit according to claim 17, wherein a terminal of the MTJ is electrically connected to one of the bit lines, and another terminal of the MTJ is electrically connected to one of the read selectors and one of the write selectors.

19. The memory circuit according to claim 17, wherein each of the magnetoresistive storage unit further comprises a spin-orbit torque (SOT) layer connected to the MTJ.

20. The memory circuit according to claim 19, wherein a terminal of the MTJ is electrically connected to one of the bit lines, another terminal of the MTJ is electrically connected to the SOT layer, and the SOT layer is electrically connected to one of the read selectors and one of the write selectors.

* * * * *